(12) United States Patent
Oba et al.

(10) Patent No.: US 6,401,018 B1
(45) Date of Patent: Jun. 4, 2002

(54) SENSOR DEVICE HAVING MALFUNCTION DETECTOR

(75) Inventors: Nobukazu Oba, Chiryu; Yoshifumi Murakami, Tokai, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/709,350

(22) Filed: Nov. 13, 2000

(30) Foreign Application Priority Data

Dec. 24, 1999 (JP) ............................................. 11-366459

(51) Int. Cl.[7] ......................... G01M 17/00; G06F 19/00
(52) U.S. Cl. ............................. 701/34; 701/31; 701/65; 327/20
(58) Field of Search .............................. 701/34, 78, 83, 701/31, 58, 65, 70; 327/20, 51, 63, 100, 384

(56) References Cited

U.S. PATENT DOCUMENTS 4,147,978 A * 4/1979 Hicks ......................... 324/142

5,384,501 A * 1/1995 Koyama et al. ............. 327/336

FOREIGN PATENT DOCUMENTS

| JP | 62-95485 | 5/1987 |
| JP | 11-144175 | 5/1999 |
| JP | 2000-146991 | 5/2000 |

* cited by examiner

*Primary Examiner*—Gertrude Arthur
(74) *Attorney, Agent, or Firm*—Law Offices of David G. Posz

(57) ABSTRACT

A sensor device includes a sensor circuit for measuring a physical amount such as pressure, a voltage detector for detecting a voltage actually supplied to the sensor circuit, and an oscillator for generating an oscillating signal when the voltage detector finds the voltage supplied to the sensor circuit is abnormally low. The sensor signal and the oscillating signal are selectively supplied to a controller. The controller controls various devices connected thereto based on the sensor signal, while it detects a malfunction of the sensor device based on either a high level signal or a low level signal in the oscillating signal. Thus, the malfunction of the sensor device is automatically detected without fail.

7 Claims, 5 Drawing Sheets

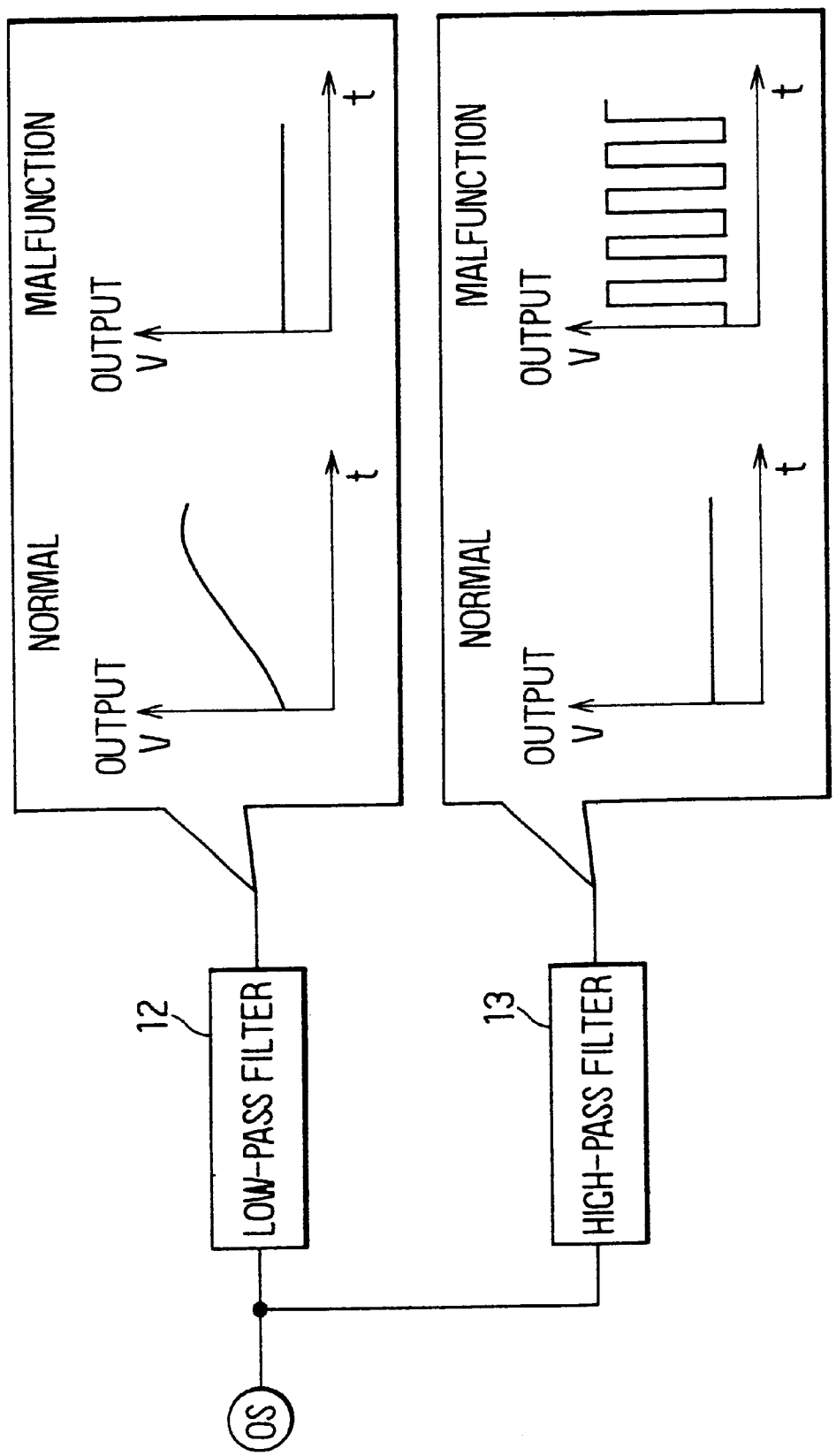

SENSOR DEVICE HAVING MALFUNCTION DETECTOR

CROSS-REFERENCE TO RELATED APPLICATION

This application is based upon and claims benefit of priority of Japanese Patent Application No. Hei-11-366459 filed on Dec. 24, 1999, the content of which is incorporated herein by reference.

BACKGROUND OF THE INVENTION

1. Field of the Invention

The present invention relates to a sensor device that includes a function in itself to detect whether it is normally functioning or malfunctioning. The sensor device is used for measuring a physical amount such as pressure, acceleration, yaw rate, or the like.

2. Description of Related Art

A sensor device for measuring various pressures in an automobile vehicle, such as a braking pressure or a fuel pressure, is connected to a control device such as an electronic control unit (ECU) that controls operation of various devices based on outputs of the sensor device. The sensor device is powered by a power source voltage. A signal representing a detected physical amount is amplified and adjusted in the sensor device and then supplied to the control device as a voltage proportional to the measured physical amount.

The sensor device is connected to the control device via a power source line for supplying power to the sensor device from the control device, a ground line, and an output line through which the sensor outputs are fed to the control device. Those connecting lines are usually connected by connectors, couplers, soldering, welding or the like. Accordingly, there is a possibility that such connections become loose or incomplete, thereby increasing contact resistance at junctions. If resistance in the power source line or the ground line increases, a power source voltage supplied to the sensor device decreases. This results in a malfunction of the sensor device, that is, the outputs of the sensor device do not correctly represent the physical amount to be measured.

SUMMARY OF THE INVENTION

The present invention has been made in view of the above-mentioned problem, and an object of the present invention is to provide an improved sensor device, in which the sensor malfunction due to the contact resistance increase in the connecting lines is automatically detected.

The sensor device of the present invention includes a sensor circuit, a voltage detector and an oscillator. Preferably, those components are all formed on a single semiconductor substrate. The sensor circuit measures a physical amount such as pressure, acceleration, yaw-rate or the like and outputs a sensor signal (a first signal) representing a measured physical amount. The voltage detector detects a voltage actually supplied to the sensor circuit and outputs a detector signal when the voltage supplied to the sensor circuit is lower than a predetermined level. The oscillator generates a signal (a second signal) oscillating between a high level and a low level, triggered by the detector signal fed from the voltage detector. The second signal indicates that the sensor circuit is malfunctioning because the sensor circuit is operating under a voltage lower than a predetermined level.

The first signal, which is a normal sensor signal, and the second signal indicating the malfunction of the sensor device are selectively supplied to a control device connected to the sensor device. The control device controls various devices connected thereto based on the first signal, while it detects the malfunction of the sensor device based on the second signal.

The maximum level of the first signal is set to a level (e.g., 4.5 V) lower than a normal power source voltage level (e.g., 5.0 V), and its minimum level (e.g., 0.5 V) is set to a level higher than a ground level. The high level of the second signal is set to a level higher than the maximum level of the first signal, and the low level is set to a level lower than the minimum level of the first signal.

The control device connected to the sensor device normally receives the first signal (the sensor signal), while it receives the second signal (the oscillating signal indicating the malfunction of the sensor device) when the voltage actually supplied to the sensor device is lower than the predetermined level.

The selection between the first signal and the second signal may be made by a switching circuit formed in the sensor device. Alternatively, a circuit having a low-pass filter that allows only the first signal having a low frequency to pass through and a high-pass filter that allows only the second signal having a high frequency to pass through may be used for selecting the signals.

The second signal is not fixed to one voltage level, but it oscillates between the high level and the low level, and the malfunction of the sensor device is detected when either the high level or the low level signal is detected. Therefore, the malfunction of the sensor device caused either by a voltage decrease in the power supply line or by a voltage increase in the ground line is surely detected without fail.

Other objects and features of the present invention will become more readily apparent from a better understanding of the preferred embodiments described below with reference to the following drawings.

BRIEF DESCRIPTION OF THE DRAWINGS

FIG. 6 is a graph showing waveforms of a low-pass filter output and a high-pass filter output in a second embodiment of the present invention.

DETAILED DESCRIPTION OF THE PREFERRED EMBODIMENTS

Figure 1:
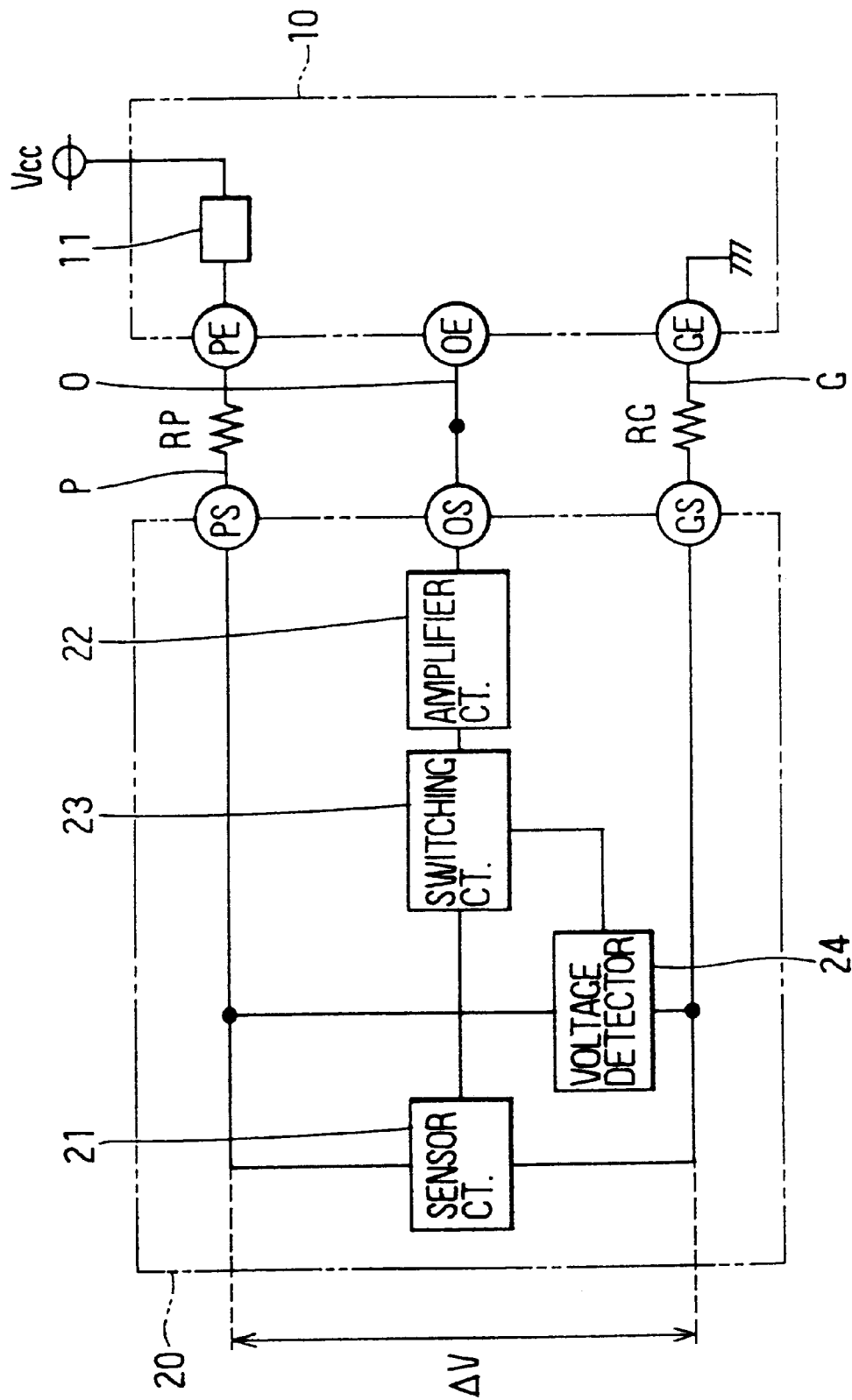
FIG. 1 is a block diagram showing a sensor device connected to a control device, as a comparative example to embodiments of the present invention.

In order to realize the object of the present invention, a prototype of a sensor device shown in FIG. 1 is made and tested. This prototype is shown and described here as a comparative example to the embodiments of the present invention. A sensor device 20 is connected to a control device 10 through a power source line P, an output line O and a ground line G. A resistance RP represents a contact resistance in the power source line P, and a resistance RG represents a contact resistance in the ground line G.

A power source terminal PS of the sensor device 20 is connected to a power source terminal PE of the control device 10 via the power source line P through which power is supplied from the control device 10 to the sensor device. An output terminal OS of the sensor device 20 is connected to an input terminal OE of the control device 10 via the output line O through which an output voltage of the sensor device 20 is fed to the control device 10. A ground terminal GS of the sensor device 20 is connected to a ground terminal GE of the control device via the ground line G through which both the sensor device 20 and the control device 10 are grounded. A power source voltage Vcc is supplied to the power source terminal PE through a regulator 11.

The sensor device 20 is composed of a sensor circuit 21, amplifier circuit 22, a switching circuit 23 and a voltage detector 24. The sensor circuit 21 is connected between the power source terminal PS and the ground terminal GS. The voltage detector 24 is also connected between PS and GS to detect a voltage $\Delta V$ (a difference between a voltage Vps at PS and a voltage Vgs at GS) supplied to the sensor circuit 21. The output of the sensor circuit 21 is fed to the amplifier circuit 22 through the switching circuit 23. When the voltage detector 24 detects that the voltage $\Delta V$ supplied to the sensor circuit 21 is lower than a predetermined level, the switching circuit 23 switches the output signal from the sensor circuit 21 to a signal level which is outside a sensor signal range, based on the signal fed from the voltage detector 24. Thus, a malfunction of the sensor device 20 is notified to the control device 10.

For example, assuming that the power source voltage Vcc is 5 V, and the normal sensor output is set in a range of 0.5 V–4.5 V, the switching circuit 23 switches the sensor signal to a low level signal LL (e.g., 4% of $\Delta V$) or to a high level signal HL (e.g., 96% of $\Delta V$) when $\Delta V$ becomes lower than a predetermined level. In other words, the LL or HL signal appears at the output terminal OS when the malfunction in the sensor device 20 is detected. The control device 10 detects the malfunction upon receipt of the LL or HL signal.

The voltage detector 24 determines that a malfunction has occurred if $\Delta V$ is out of a predetermined voltage range. In this case, however, whether the voltage Vps has decreased due to an increase of the contact resistance RP, or Vgs has increased due to an increase of the contact resistance RG cannot be determined. This brings about the following problem. For example, if the malfunction signal level is set to HL (96% of $\Delta V$), and the voltage $\Delta V$ becomes lower than the predetermined level (e.g., 4.5 V) due to increase of the contact resistance RP, the output terminal voltage Vos relative to the ground level (Vge) becomes 4.32 V (=4.5 V×96%) which is within the normal sensor output range. If the voltage $\Delta V$ becomes lower than the predetermined level due to increase of the contact resistance PG, the output terminal voltage Vos relative to the ground level (Vge) becomes 4.82 V (=4.5 V×96%+0.5 V) which is outside the normal sensor output range, because the voltage Vgs increases by 0.5 V due to increase of the contact resistance RG. This means that the terminal voltage Vos cannot indicate the malfunction when Vps decreases, while it correctly indicates the malfunction when Vgs increases.

On the other hand, if the malfunction signal level is set to LL (4% of $\Delta V$), and the voltage $\Delta V$ becomes lower than the predetermined level (e.g., 4.5 V) due to increase of the contact resistance RP, the output terminal voltage Vos relative to the ground level (Vge) becomes 0.18 V (=4.5 V×4%) which is outside the normal sensor output range. If the voltage $\Delta V$ becomes lower than the predetermined level due to increase of the contact resistance RG, the output terminal voltage Vos relative to the ground level (Vge) becomes 0.68 V (=4.5 V×4+0.5 V) which is within the normal sensor output range, because the voltage Vgs increases by 0.5 V due to increase of the contact resistance RG. This means that the terminal voltage Vos cannot indicate the malfunction when Vgs increases, while it correctly indicates the malfunction when Vps decreases.

Figure 2:
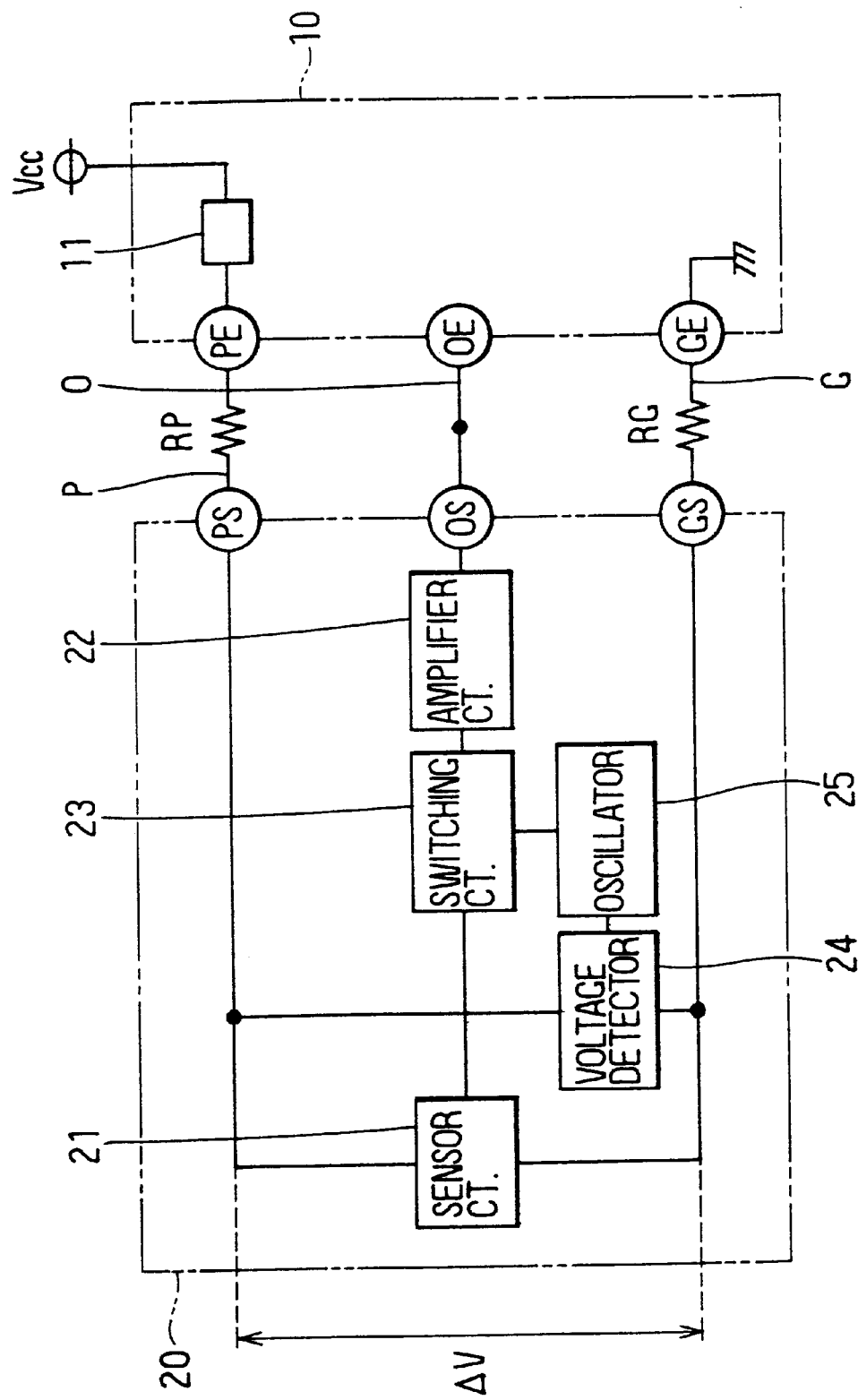
FIG. 2 is a block diagram showing a sensor device connected to a control device, as a first embodiment of the present invention.

A first embodiment of the present invention shown in FIGS. 2–5 has been made to overcome the problem found in the above-described comparative example. The sensor device 20 is for use in an automobile and is designed for measuring an oil pressure in a braking system, a fuel pressure in a fuel injection system or the like. The sensor device 20 shown in FIG. 2 is similar to the sensor device shown in FIG. 1, except that an oscillator 25 is added between the voltage detector 24 and the switching circuit 23. The sensor device 20 is connected to the control device 10 in the same manner as in the comparative example shown in FIG. 1 and functions similarly. Therefore, only the structure and function different from those of the comparative example will be described below.

The power source voltage Vcc (e.g., 12 V) is supplied to the control device 10 through a regulator 11 that converts Vcc to a sensor power source voltage Vps (e.g., 5 V). The sensor circuit 21 outputs a first signal representing a measured pressure, and the oscillator 25 outputs a second signal indicating a malfunction of the sensor device 20 caused by decrease of the voltage $\Delta V$ imposed on the sensor circuit 21. The first and the second signal are selectively switched by the switching circuit 23 and are led to the output terminal OS through the amplifier 22.

The sensor circuit 21 is composed of a Wheatstone bridge including four gauge resistors such as diffused resistors formed on a thin diaphragm (not shown) of a silicon semiconductor substrate. The oscillator 25 outputs an oscillating signal triggered by the output of the voltage detector 24 that indicates the voltage $\Delta V$ has become lower than a predetermined level. The sensor circuit 21, the amplifier circuit 22, the voltage detector 24 and the oscillator 25 are all formed on a single semiconductor substrate.

Figure 3:
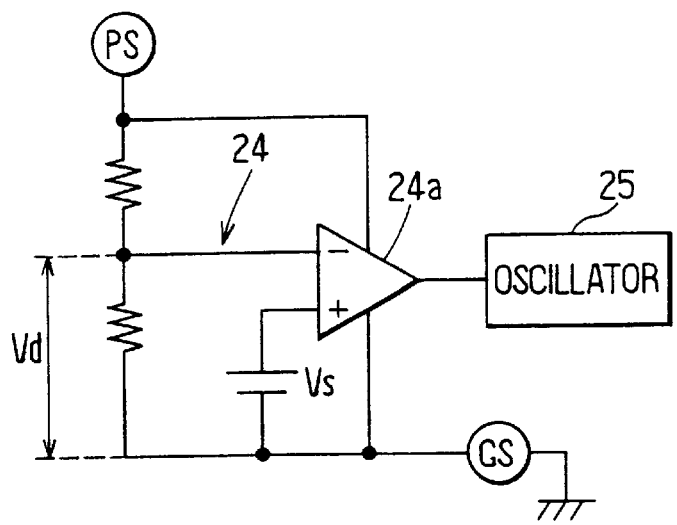
FIG. 3 is a circuit diagram showing a voltage detector used in the sensor device shown in FIG. 2.

FIG. 3 shows details of the voltage detector 24 connected to the oscillator 25. The voltage detector determines that a malfunction occurred if the voltage $\Delta V$ (Vps–Vgs) becomes lower than a predetermined level (e.g., 4.5 V). As shown in FIG. 3, the voltage $\Delta V$ is divided by resistors to obtain a divided voltage Vd. The divided voltage Vd is compared with a standard voltage Vs which is independent from the voltage $\Delta V$ in a comparator 24a. The comparator 24a outputs a malfunction signal to trigger the oscillator 25 when the voltage $\Delta V$ becomes lower than the predetermined level.

Figure 4:
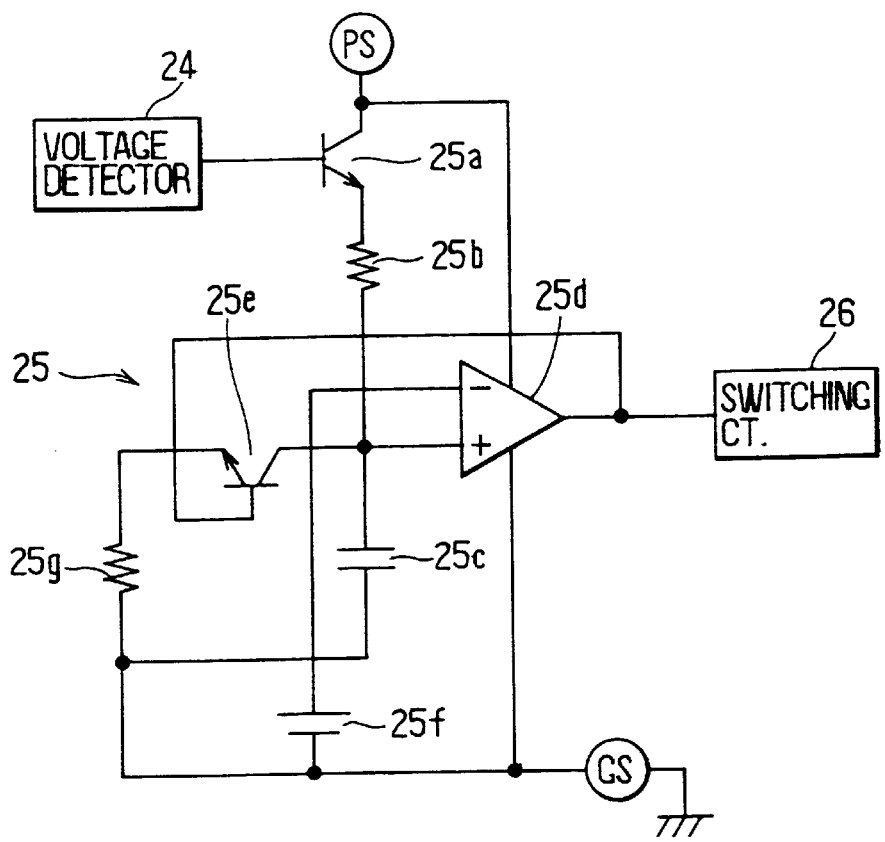
FIG. 4 is a circuit diagram showing an oscillator used in the sensor device shown in FIG. 2.

Referring to FIG. 4, operation of the oscillator 25 will be described. A transistor 25a is turned on by the malfunction signal fed from the voltage detector 24, and current is supplied to a capacitor 25c through a resistor 25b. The capacitor 25c is charged with a time constant determined by the resistor 25b and the capacitor 25c. A comparator 25d compares a terminal voltage of the capacitor 25c with a standard voltage 25f. When the terminal voltage of capacitor 25c is higher than the standard voltage 25f, the comparator 25d outputs a high level signal HL (e.g., 96% of $\Delta V$) which exceeds a normal sensor output range (e.g., 0.5 V–4.5 V). A transistor 25e is turned on by the high level signal HL, and thereby the capacitor 25c is discharged through a resister 25g with a time constant determined by the capacitor 25c and the resistor 25g. When the terminal voltage of the capacitor 25c is lower than the standard voltage 25f, the comparator 25d outputs a low level signal LL (e.g., 4% of $\Delta V$) which is lower than the normal sensor output range.

The oscillator 25 functions as described above and outputs the second signal oscillating between the high level signal HL and the low level signal LL. The frequency and waveform of the oscillating signal can be arbitrarily set by selecting the capacitance of the capacitor 25c and the resistance of the resistors 25b, 25g.

Figure 5:
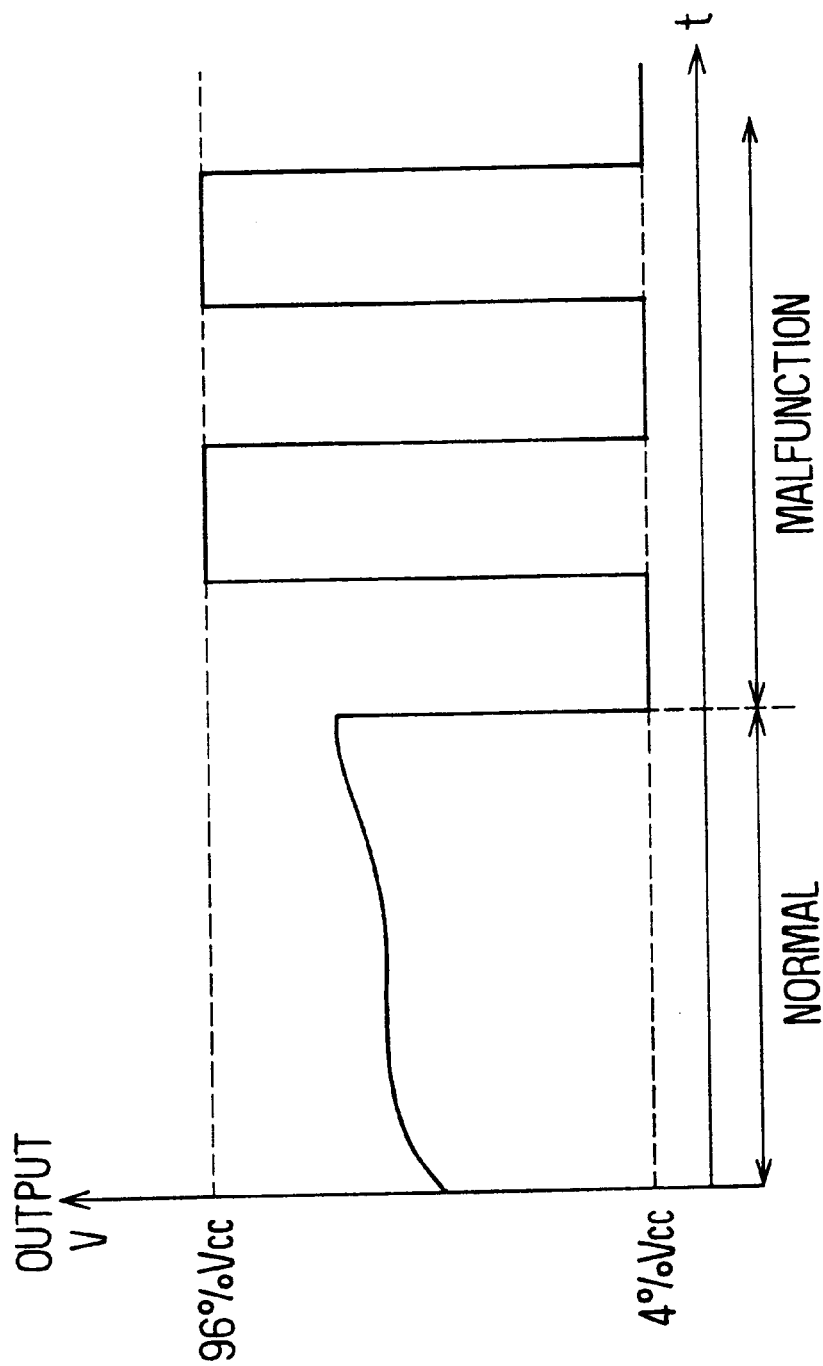
FIG. 5 is a graph showing waveforms of a sensor output and an oscillator output.

The switching circuit 23 normally outputs the sensor signal (the first signal) fed from the sensor circuit 21, while it outputs the oscillating signal (the second signal) when the oscillating signal is fed from the oscillator 25. The outputs from the switching circuit 23 are shown in FIG. 5. As seen from the graph of FIG. 5, when the voltage $\Delta V$ is within the predetermined range, the switching circuit 23 outputs the normal sensor output as the first signal. When the voltage $\Delta V$ is out of the predetermined range (the sensor device is malfunctioning), the switching circuit 23 outputs the oscillating signal as the second signal.

If the second signal indicating the malfunction of the sensor device 20 is fixed to either the high level HL or the low level LL, the malfunction cannot be detected under certain conditions, as described above in connection with the comparative example. As the second signal in the first embodiment is a signal oscillating between HL and LL, the malfunction of the sensor device 20 is always detected without fail. That is, when the high level signal HL, with which the malfunction cannot be detected because it falls within the normal sensor output range, is generated due to the Vps decrease, the malfunction is detected by the low level signal LL that immediately follows the high level signal HL. Similarly, when the low level signal LL, with which the malfunction cannot be detected because it falls within the normal sensor output range, is generated due to the Vgs increase, the malfunction is detected by the high level signal HL that immediately follows the low level signal LL. In short, the malfunction is always detected by the second signal oscillating between HL and LL, not depending on the causes of the $\Delta V$ decrease.

The control device 10 performs periodical sampling (e.g., with an interval of 5–10 m sec) of the signal fed from the sensor device 20. Accordingly, if an oscillating period of the second signal is set to about 1.5 times the sampling interval, at least one high level signal HL or one low level signal LL can be detected during three times of the sampling operation.

A second embodiment of the present invention will be described with reference to FIG. 6. In this embodiment, a low-pass filter 12 as a first filter and a high-pass filter 13 as a second filter is connected to the output terminal OS of the sensor device 20. Outputs of the respective filters are connected to the input terminal of the control device 10. As shown in FIG. 6, only the sensor output signal (the first signal) having a low frequency passes through the low-pass filter 12. On the other hand, only the malfunction signal (the second signal) having a high frequency passes through the high-pass filter 13.

In other words, the sensor signal is fed to the control device 10 when the sensor device 20 is normally operating, while the malfunction signal is fed when the sensor device is malfunctioning. Therefore, the first signal passed through the low-pass filter 12 is utilized to control various devices connected to the control device 10, and the second signal passed through the high-pass filter 13 is utilized to detect the malfunction of the sensor device 20.

The switching circuit 2.3 may be replaced with a circuit composed of the low-pass filter 12 and the high-pass filter 13.

The gauge resistors used in the Wheatstone bridge constituting the sensor circuit 21 may be replaced with other resistors. For example, thin film resistors made of a temperature-insensitive metal such as CrSi, or other sensors such as capacitor-sensors may be used. Though the sensor device 20 is described as a pressure sensor, it can be used also as an acceleration sensor, a yaw-rate sensor or the like.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A sensor device connected to a control device through a power source line, a ground line and an output line, the sensor device comprising:
   a sensor circuit for measuring a physical amount including one of pressure, acceleration and yaw rate, the sensor circuit being connected between the power source line and the ground line, the sensor circuit outputting a first signal representing the measured physical amount;
   a voltage detector for detecting a voltage between the power source line and the ground line, the voltage detector outputting a malfunction signal when the detected voltage is out of a predetermined range;
   an oscillator, connected to the voltage detector, for generating a second signal oscillating between a high level signal and a low level signal upon receipt of the malfunction signal from the voltage detector; and
   means for outputting the first signal to the output line in absence of the second signal and the second signal when the voltage detector outputs the second signal.

2. The sensor device as in claim 1, wherein:
   the control device controls various devices connected thereto based on the first signal fed from the output line; and
   the control device detects a malfunction of the sensor device based on the second signal.

3. The sensor device as in claim 2, wherein:
   the first signal is set to have a maximum level which is lower than a predetermined voltage level of the power source line and a minimum level which is higher than a normal voltage level of the ground line;
   the high level signal in the second signal is set to a level which is higher than the maximum level of the first signal, and the low level signal in the second signal is set to a level which is lower than the minimum level of the first signal; and
   the malfunction of the sensor device is detected when either the high level signal or the low level signal in the second signal is detected by the control device.

4. The sensor device as in claim 1, wherein:
   the outputting means is a switching circuit for selectively outputting the first signal or the second signal.

5. The sensor device as in claim 1, wherein:
   the outputting means is composed of a first filter for outputting only the first signal and a second filter for outputting only the second signal.

6. The sensor device as in claim 1, wherein:

the sensor circuit, the voltage detector and the oscillator are formed on a single semiconductor substrate.

7. The sensor device as in claim 1, further including a first filter outputting only the first signal and a second filter outputting only the second signal, both filters being respectively connected to the output line, so that outputs from both filters are fed to the control device.

* * * * *